(12) United States Patent
Lu et al.

(10) Patent No.: US 12,293,969 B2
(45) Date of Patent: May 6, 2025

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chi-Ta Lu, Yilan County (TW); Chi-Ming Tsai, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 462 days.

(21) Appl. No.: 17/816,277

(22) Filed: Jul. 29, 2022

(65) Prior Publication Data

US 2022/0367356 A1 Nov. 17, 2022

Related U.S. Application Data

(63) Continuation of application No. 17/026,283, filed on Sep. 20, 2020, now Pat. No. 11,476,193, which is a continuation of application No. 16/212,112, filed on Dec. 6, 2018, now Pat. No. 10,784,196.

(60) Provisional application No. 62/736,967, filed on Sep. 26, 2018.

(51) Int. Cl.
*H01L 23/528* (2006.01)
*H01L 21/768* (2006.01)

(52) U.S. Cl.
CPC .... *H01L 23/5283* (2013.01); *H01L 21/76816* (2013.01); *H01L 21/76879* (2013.01)

(58) Field of Classification Search
CPC .. H01L 21/76802–76817; H01L 23/52–52389
See application file for complete search history.

(56) References Cited

U.S. PATENT DOCUMENTS 6,127,070 A * 10/2000 Yang ................... H01L 21/0274
438/692

* cited by examiner

*Primary Examiner* — Daniel P Shook
(74) *Attorney, Agent, or Firm* — WPAT LAW; Anthony King

(57) ABSTRACT

A semiconductor structure includes a substrate including a first surface; a dielectric layer disposed over the first surface of the substrate; a first conductive line surrounded by the dielectric layer and extended over the first surface of the substrate; a second conductive line disposed adjacent to the first conductive line, surrounded by the dielectric layer and extended parallel to the first conductive line; a conductive via disposed over the first conductive line and extended through the dielectric layer; and a cross section of the conductive via substantially parallel to the first surface of the substrate, wherein the cross section of the conductive via is at least partially protruded from the first conductive line towards the second conductive line. Further, a method of manufacturing the semiconductor structure is also disclosed.

20 Claims, 15 Drawing Sheets

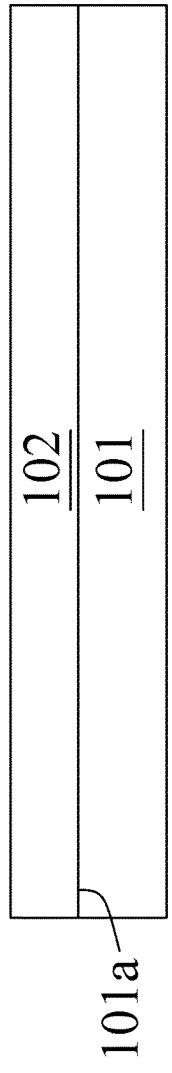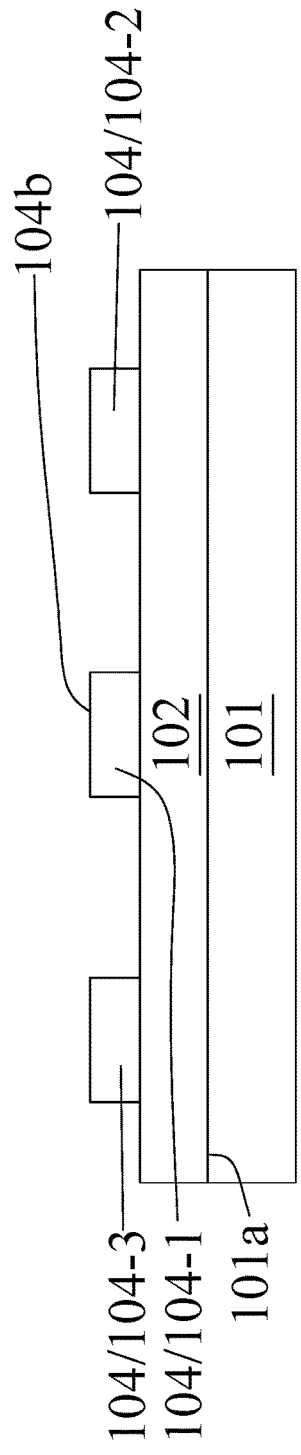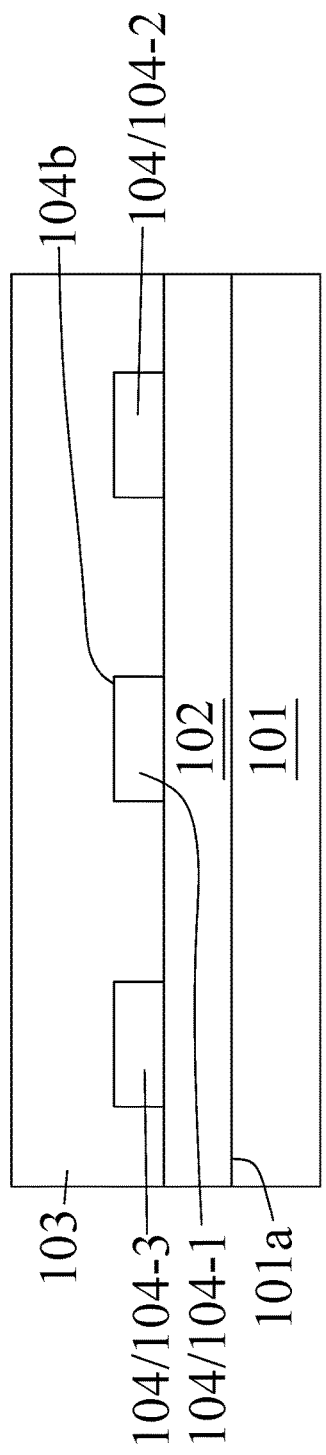

SEMICONDUCTOR STRUCTURE AND MANUFACTURING METHOD THEREOF

PRIORITY CLAIM AND CROSS-REFERENCE

This application is a continuation application of U.S. non-provisional application Ser. No. 17/026,283 filed on Sep. 20, 2020, entitled "SEMICONDUCTOR STRUCTURE AND MANUFACTURING METHOD THEREOF," and U.S. non-provisional application Ser. No. 16/212,112 filed on Dec. 6, 2018, entitled "SEMICONDUCTOR STRUCTURE AND MANUFACTURING METHOD THEREOF," and claims the benefit of provisional application Ser. 62/736,967 filed on Sep. 26, 2018, entitled "SEMICONDUCTOR STRUCTURE AND MANUFACTURING METHOD THEREOF," the disclosure of which is hereby incorporated by reference in its entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, misalignment of components or other issues, resulting in a high yield loss of the semiconductor device. The semiconductor device is produced in an undesired configuration, which would further exacerbate materials wastage and thus increase the manufacturing cost.

Since more different small components are involved, a complexity of the manufacturing operations of the semiconductor device is increased. As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6-17 are schematic views of manufacturing a semiconductor structure by a method of FIG. 5 in accordance with some embodiments of the present disclosure.

DETAILED DESCRIPTION OF THE DISCLOSURE

Figure 1:
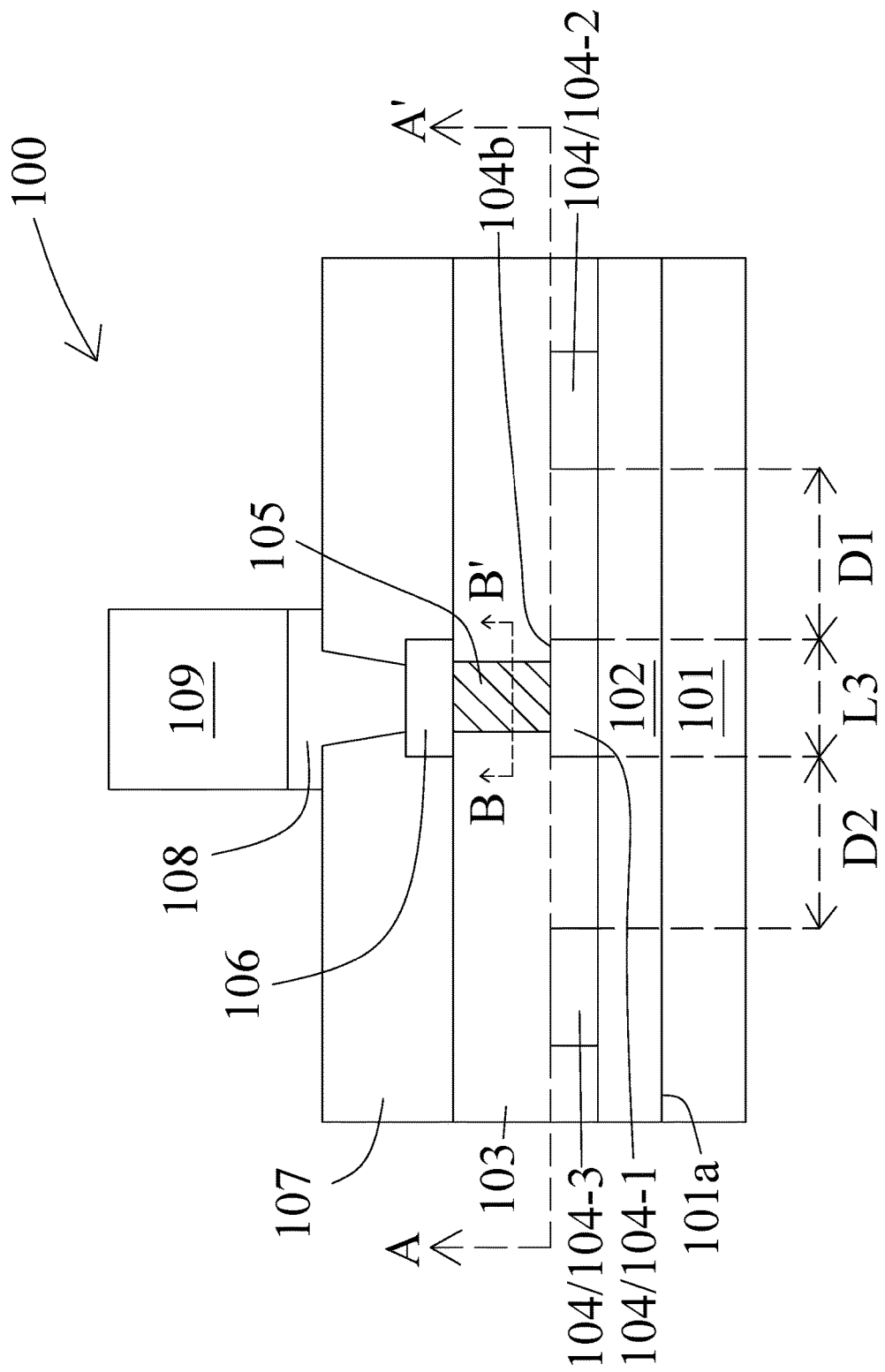
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure is involved in a semiconductor structure. The interconnect structure includes several metal lines extended over different layers of the semiconductor structure and several conductive vias connecting metal lines at different layers of the semiconductor structure. The conductive via connects two or more metal lines at different layers of the semiconductor structure. However, an overall size of the semiconductor structure becomes smaller and smaller. A space between two adjacent metal lines at the same layer also becomes smaller and smaller. As such, the two adjacent metal lines at the same layer may be easily bridged by the conductive via, which leads to failure of electrical connection between metal lines. As a result, reliability of the semiconductor structure would be adversely affected.

In the present disclosure, a semiconductor structure is disclosed. The semiconductor structure includes a substrate including a first surface, a dielectric layer disposed over the first surface of the substrate, a conductive line surrounded by the dielectric layer and extended over the first surface of the substrate, and a conductive via disposed over the conductive line and extended through the dielectric layer. The conductive via includes a cross section substantially parallel to the first surface of the substrate. The conductive line includes a second surface at least partially interfaced with the conductive via. The second surface of the conductive line includes a first end, a second end opposite to the first end and a first central axis passing through the first end and the second end. The cross section of the conductive via includes a second central axis substantially parallel to the first central axis and a third central axis substantially orthogonal to the second central axis. The cross section of the conductive via includes a longest length along the second central axis and a shortest length along the third central axis. As such, a contour of the cross section of the conductive via is in an elliptical shape. Therefore, the conductive via undesirably contacting with another conductive structure adjacent to the conductive line is prevented. The conductive line would not undesirably connect with another conductive structure by the conductive via.

Further, a method of manufacturing a semiconductor structure is disclosed. The method includes providing a first substrate including a first surface, forming a conductive line over the first surface of the first substrate, disposing a dielectric layer over the first surface of the first substrate and the conductive line, providing a photomask including a second substrate, an opaque material disposed over the second substrate and a first recess extended through the opaque material, placing the photomask over the dielectric layer, projecting a predetermined electromagnetic radiation over the photomask through the first recess towards the dielectric layer, removing a portion of the dielectric layer exposed to the predetermined electromagnetic radiation to form a second recess extended through the dielectric layer, and disposing a conductive material into the second recess to form a conductive via. A cross section of the first recess substantially parallel to the first surface of the first substrate includes a first side and a second side substantially orthogonal to the first side. A first length of the first side is substantially greater than a second length of the second side. A contour of the cross section of the first recess of the photomask is in a rectangular or a non-square shape. As a result, a contour of a cross section of the conductive via in an elliptical shape is formed.

Figure 2:
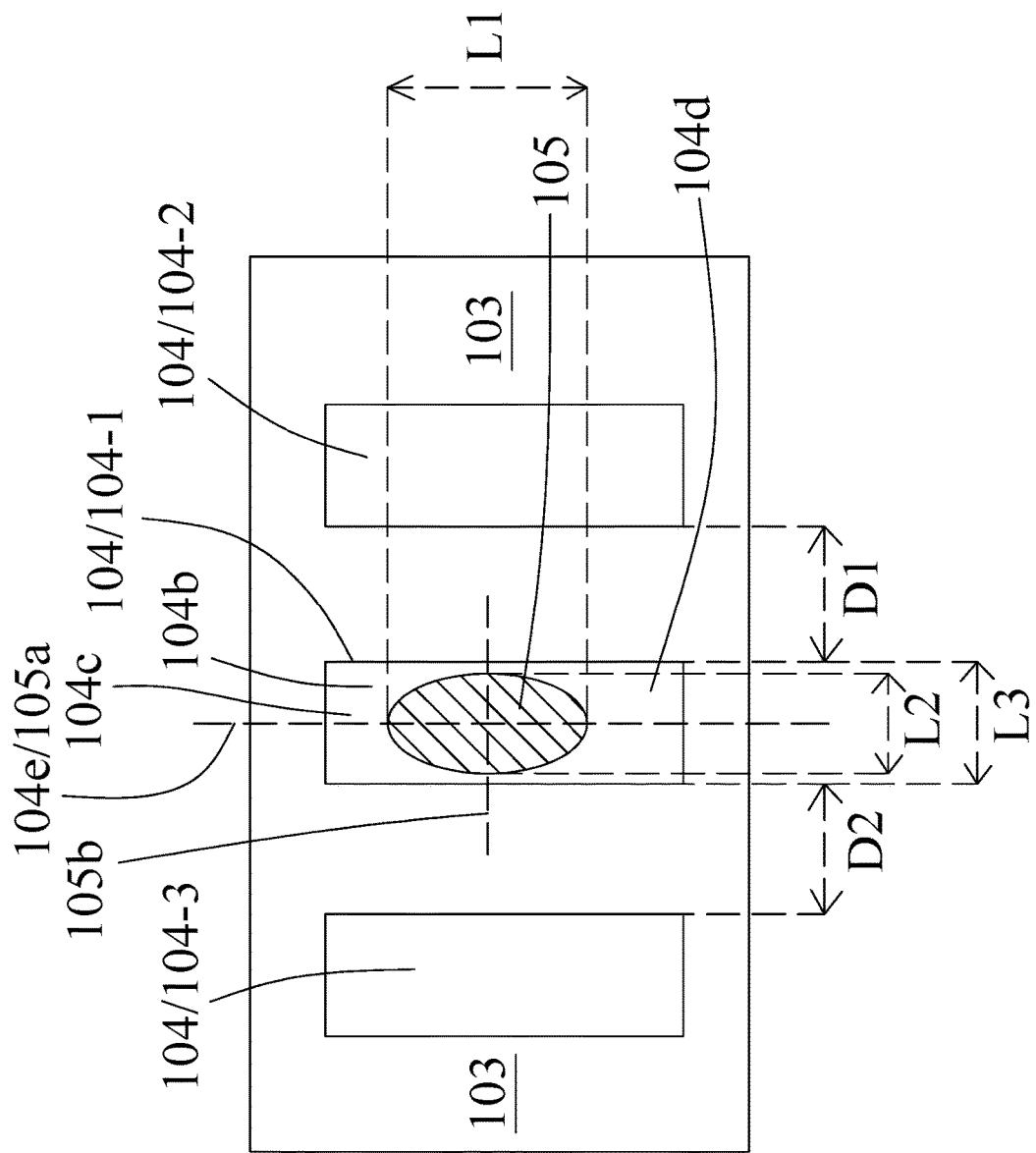
FIG. 2 is a schematic top cross sectional view of FIG. 1 along AA'.

FIG. 1 is a schematic cross sectional view of a semiconductor structure 100 in accordance with various embodiments of the present disclosure, and FIG. 2 is a schematic top view of the semiconductor structure 100 along AA' of FIG. 1. In some embodiments, the semiconductor structure 100 includes a substrate 101, a dielectric layer 103, a conductive line 104 and a conductive via 105. In some embodiments, the semiconductor structure 100 is a part of a die or a package. In some embodiments, the semiconductor structure 100 is configured to connect with another semiconductor structure such as a printed circuit board (PCB).

In some embodiments, the substrate 101 includes semiconductive materials such as silicon or other suitable materials. In some embodiments, the substrate 101 is a silicon substrate or silicon wafer. In some embodiments, the substrate 101 includes a first surface 101a. In some embodiments, the first surface 101a of the substrate 101 is a front side of the substrate 101.

In some embodiments, an interlayer dielectric (ILD) 102 is disposed over the substrate 101. In some embodiments, the ILD 102 is disposed over the first surface 101a of the substrate 101. In some embodiments, the ILD 102 includes dielectric material such as silicon oxide, borophosphosilicate glass (BPSG), phosphosilicate glass (PSG) or the like. In some embodiments, a gate structure is disposed in the ILD 102. In some embodiments, several semiconductor devices such as transistors or the like are disposed in the ILD 102.

In some embodiments, the dielectric layer 103 is disposed over the substrate 101. In some embodiments, the dielectric layer 103 is disposed over the first surface 101a of the substrate 101. In some embodiments, the dielectric layer 103 includes several layers of dielectric material stacking over each other. In some embodiments, the dielectric layer 103 is an intermetal dielectric (IMD) surrounding several conductive structures. In some embodiments, the dielectric layer 103 includes dielectric material such as silicon oxide, undoped silicate glass (USG), fluorinated silicate glass (FSG) or the like.

In some embodiments, the conductive line 104 is disposed over the substrate 101. In some embodiments, the conductive line 104 is disposed over the first surface 101a of the substrate 101. In some embodiments, the conductive line 104 is disposed over the ILD 102. In some embodiments, the conductive line 104 is surrounded by the dielectric layer 103 and extended over the first surface 101a of the substrate 101. In some embodiments, the conductive line 104 includes copper, gold, silver, aluminum or the like. In some embodiments, a semiconductor device in the ILD 102 is electrically connected to the conductive line 104.

In some embodiments, the conductive line 104 includes a first conductive line 104-1, a second conductive line 104-2 and a third conductive line 104-3. In some embodiments, the first conductive line 104-1 is disposed between the second conductive line 104-2 and the third conductive line 104-3. In some embodiments, the first conductive line 104-1, the second conductive line 104-2 and the third conductive line 104-3 are extended substantially parallel to each other. In some embodiments, the first conductive line 104-1, the second conductive line 104-2 and the third conductive line 104-3 are in rectangular shape.

In some embodiments, a first gap D1 between the first conductive line 104-1 and the second conductive line 104-2 and a second gap D2 between the first conductive line 104-1 and the third conductive line 104-3 are substantially the same as each other. In some embodiments, the first gap D1 and the second gap D2 are about 20 nm to about 25 nm. In some embodiments, the first gap D1 and the second gap D2 are about 24 nm. In some embodiments, the first conductive line 104-1, the second conductive line 104-2 and the third conductive line 104-3 are substantially the same in thickness.

In some embodiments, the conductive via 105 is disposed over the first conductive line 104-1 and extended through the dielectric layer 103. In some embodiments, the conductive via 105 is coupled with the first conductive line 104-1. In some embodiments, the conductive via 105 is surrounded by the dielectric layer 103. In some embodiments, the conductive via 105 is extended substantially orthogonal to the first conductive line 104-1. In some embodiments, the conductive via 105 is extended substantially orthogonal to the first surface 101a of the substrate 101. In some embodiments, the conductive via 105 is isolated from the second conductive line 104-2 and the third conductive line 104-3. In some embodiments, the conductive via 105 includes copper, gold, silver, aluminum or the like. In some embodiments, the conductive via 105 includes aluminum copper (AlCu) alloy.

In some embodiments, the first conductive line 104-1 includes a second surface 104b substantially parallel to the first surface 101a of the substrate 101. In some embodiments, the second surface 104b of the first conductive line 104-1 is partially covered by the dielectric layer 103. In some embodiments, the second surface 104b of the first conductive line 104-1 is coupled with the conductive via 105. In some embodiments, the second surface 104b of the first conductive line 104-1 is at least partially interfaced with the conductive via 105.

In some embodiments, the second surface 104b of the first conductive line 104-1 includes a first end 104c and a second end 104*d* opposite to the first end 104*c*. In some embodiments, the second surface 104*b* of the first conductive line 104-1 includes a first central axis 104*e* passing through the first end 104*c* and the second end 104*d*. In some embodiments, the first central axis 104*e* is extended along a longest length of the first conductive line 104-1. In some embodiments, the first central axis 104*e* passes through a center of the first conductive line 104-1.

In some embodiments, the conductive via 105 includes a cross section substantially parallel to the first surface 101*a* of the substrate 101. In some embodiments, the cross section of the conductive via 105 is a cross section along BB'. In some embodiments, the cross section of the conductive via 105 is an interface between the conductive via 105 and the first conductive line 104-1. In some embodiments, the cross section of the conductive via 105 is a cross section along AA'. In some embodiments, the cross section of the conductive via 105 along AA' is substantially coplanar with the second surface 104*b* of the first conductive line 104-1. In some embodiments, the cross section of the conductive via 105 along AA' is disposed within the second surface 104*b* of the first conductive line 104-1.

In some embodiments, the cross section of the conductive via 105 includes a second central axis 105*a* substantially parallel to the first central axis 104*e* of the first conductive line 104-1, and a third central axis 105*b* substantially orthogonal to the second central axis 105*a*. In some embodiments, the second central axis 105*a* of the conductive via 105 is disposed above and vertically aligned with the first central axis 104*e* of the second surface 104*b* of the first conductive line 104-1. In some embodiments, the second central axis 105*a* and the third central axis 105*b* pass through a center of the cross section of the conductive via 105.

In some embodiments, the cross section of the conductive via 105 includes a longest length L1 along the second central axis 105*a* and a shortest length L2 along the third central axis 105*b*. In some embodiments, the longest length L1 is substantially greater than the shortest length L2. In some embodiments, the cross section of the conductive via 105 is in an elliptical shape. In some embodiments, the shortest length L2 of the cross section of the conductive via 105 is substantially less than a width L3 of the first conductive line 104-1 substantially parallel to the third central axis 105*b* of the cross section of the conductive via 105.

Figure 3:
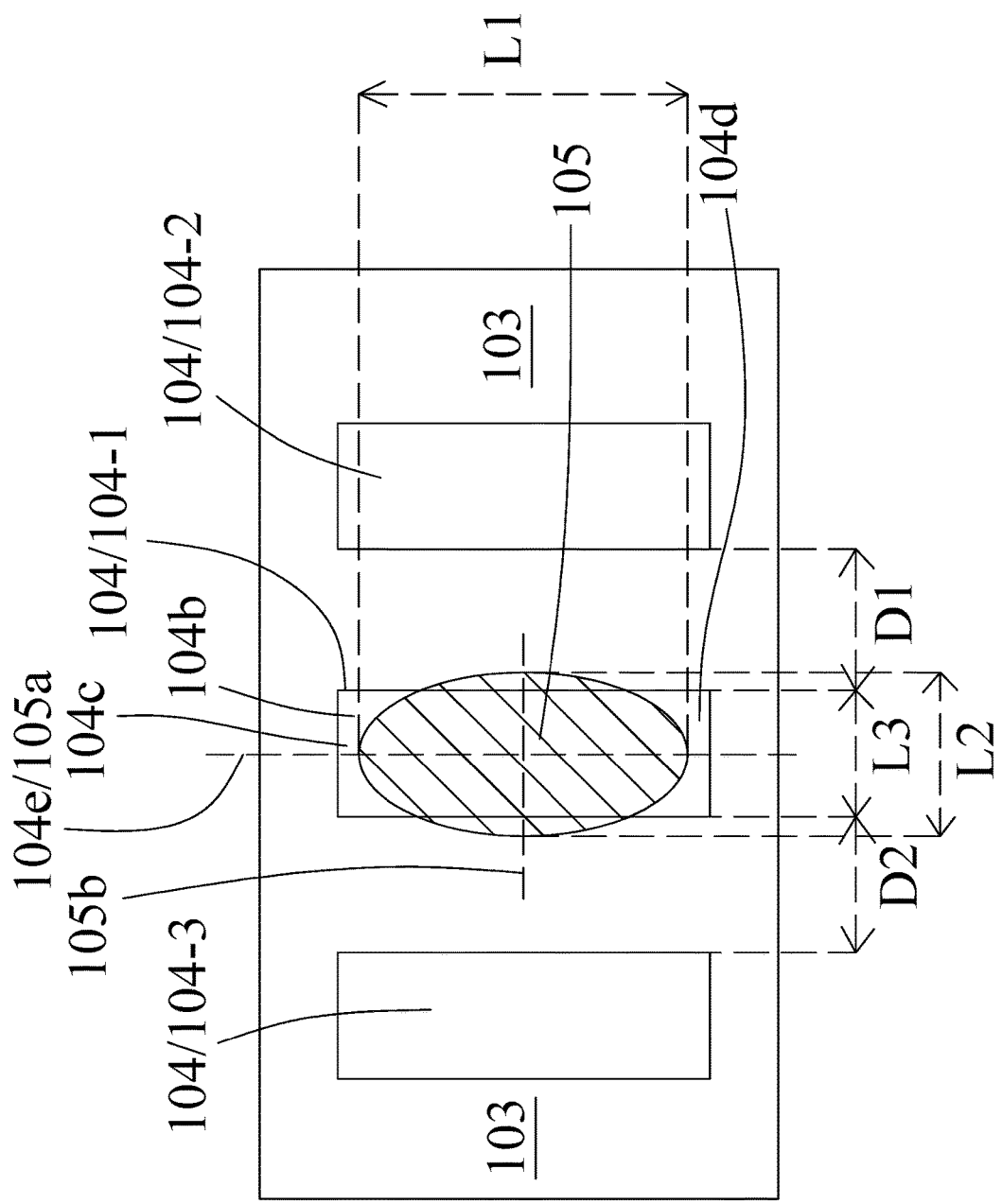
FIG. 3 is another embodiment of a schematic top cross sectional view of FIG. 1 along AA'.

In some embodiments as shown in FIG. 3, the shortest length L2 of the conductive via 105 is substantially greater than the width L3 of the first conductive line 104-1. In some embodiments, a portion of the cross section of the conductive via 105 is protruded from the second surface 104*b* of the first conductive line 104-1. In some embodiments, a portion of the cross section of the conductive via 105 is protruded towards the second conductive line 104-2 or the third conductive line 104-3. In some embodiments, the conductive via 105 is isolated from the second conductive line 104-2 and the third conductive line 104-3.

Figure 4:
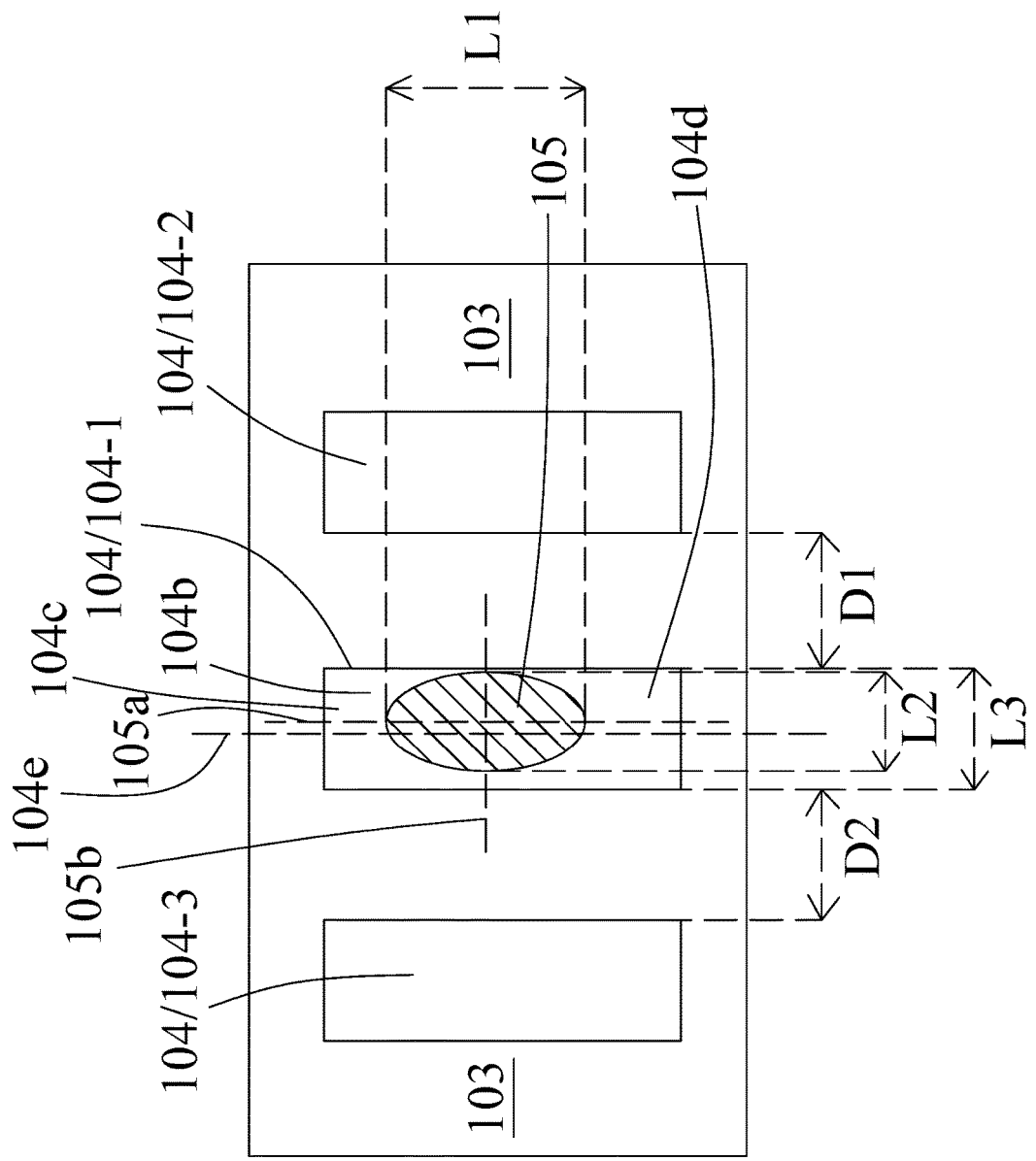
FIG. 4 is another embodiment of a schematic top cross sectional view of FIG. 1 along AA'.

In some embodiments as shown in FIG. 4, the second central axis 105*a* of the conductive via 105 is deviated from the first central axis 104*e* of the first conductive line 104-1. In some embodiments, the second central axis 105*a* of the conductive via 105 is not vertically aligned with the first central axis 104*e* of the first conductive line 104-1. In some embodiments, the second central axis 105*a* of the conductive via 105 is not common with the first central axis 104*e* of the first conductive line 104-1.

Referring to FIG. 1, in some embodiments, a fourth conductive line 106 is extended over the dielectric layer 103 and coupled with the conductive via 105. In some embodiments, the fourth conductive line 106 is electrically connected to the first conductive line 104-1 through the conductive via 105. In some embodiments, the fourth conductive line 106 is extended above and substantially orthogonal to the first conductive line 104-1, the second conductive line 104-2 or the third conductive line 104-3. In some embodiments, the fourth conductive line 106 includes copper, gold, silver, aluminum or the like.

In some embodiments, a second dielectric layer 107 is disposed over the dielectric layer 103. In some embodiments, the second dielectric layer 107 includes several layers of dielectric material stacking over each other. In some embodiments, the second dielectric layer 107 surrounds the fourth conductive line 106. In some embodiments, the dielectric layer 103 includes dielectric material such as silicon oxide or the like.

In some embodiments, a conductive pad 108 is disposed over the fourth conductive line 106. In some embodiments, a portion of the conductive pad 108 is extended through the second dielectric layer 107 and is contacted with the fourth conductive line 106. In some embodiments, the conductive pad 108 is electrically connected to the first conductive line 104-1 through the conductive via 105 and the fourth conductive line 106. In some embodiments, the conductive pad 108 is under bump metallization (UBM) pad. In some embodiments, the conductive pad 108 includes gold, silver, copper, nickel, tungsten, aluminum, palladium and/or alloys thereof.

In some embodiments, a conductive bump 109 is disposed over and electrically connected with the conductive pad 108. In some embodiments, the conductive bump 109 is configured to electrically connect to a circuitry or a conductive structure. In some embodiments, the conductive bump 109 includes conductive material includes solder, copper, nickel, gold or the like. In some embodiments, the conductive bump 109 is a conductive pillar, a solder ball, microbump or the like. In some embodiments, the conductive bump 109 is in a spherical, hemispherical or cylindrical shape.

Figure 5:
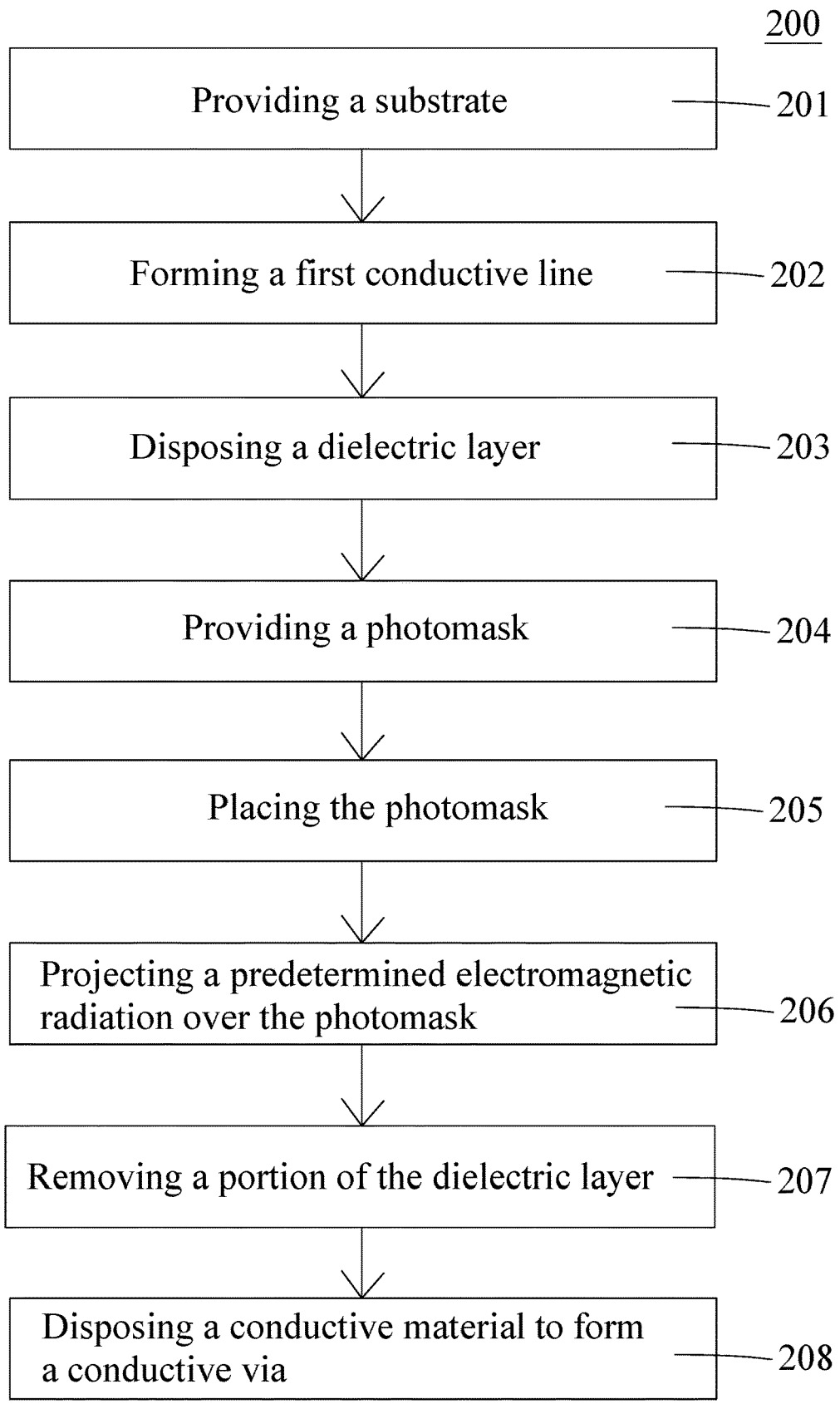
FIG. 5 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 200. The method 200 includes a number of operations and the description and illustration are not deemed as a limitation as the sequence of the operations. FIG. 5 is an embodiment of the method 200 of manufacturing a semiconductor structure. The method 200 includes a number of operations (201, 202, 203, 204, 205, 206, 207 and 208).

In operation 201, a first substrate 101 is provided as shown in FIG. 6. In some embodiments, an ILD 102 is also provided over the first substrate 101. In some embodiments, the first substrate 101 includes silicon or the like. In some embodiments, the first substrate 101 includes a first surface 101*a*. In some embodiments, the ILD 102 is formed over the first surface 101*a* of the first substrate 101. In some embodiments, the formation of the ILD 102 includes disposing a dielectric material such as silicon oxide, BPSG, phosphosilicate PSG or the like, and forming a semiconductor device such as transistor or the like in the dielectric material. In some embodiments, the dielectric material is disposed by chemical vapor deposition (CVD) or any other suitable operations.

In operation 202, a conductive line 104 is formed as shown in FIG. 7. In some embodiments, several conductive lines 104 are formed over the ILD 102. In some embodiments, the conductive lines 104 are formed over the first surface 101*a* of the first substrate 101. In some embodiments, the conductive line 104 is formed by sputtering, electroplating or any other suitable operations. In some embodiments, the conductive line 104 includes copper, gold, silver, aluminum or the like.

In some embodiments, the conductive lines 104 include a first conductive line 104-1, a second conductive line 104-2 and a third conductive line 104-3. In some embodiments, the first conductive line 104-1, the second conductive line 104-2 and the third conductive line 104-3 are extended substantially parallel to each other. In some embodiments, the first conductive line 104-1, the second conductive line 104-2 and the third conductive line 104-3 are in rectangular shape. In some embodiments, the first conductive line 104-1 is disposed between the second conductive line 104-2 and the third conductive line 104-3.

In operation 203, a dielectric layer 103 is disposed over the first substrate 101 and the conductive line 104 as shown in FIG. 8. In some embodiments, the dielectric layer 103 is disposed over the first surface 101a of the first substrate 101. In some embodiments, the conductive line 104 is covered by the dielectric layer 103. In some embodiments, the dielectric layer 103 is formed by disposing a dielectric material such as silicon oxide or the like. In some embodiments, the dielectric material is disposed by CVD or any other suitable operations.

Figure 9:
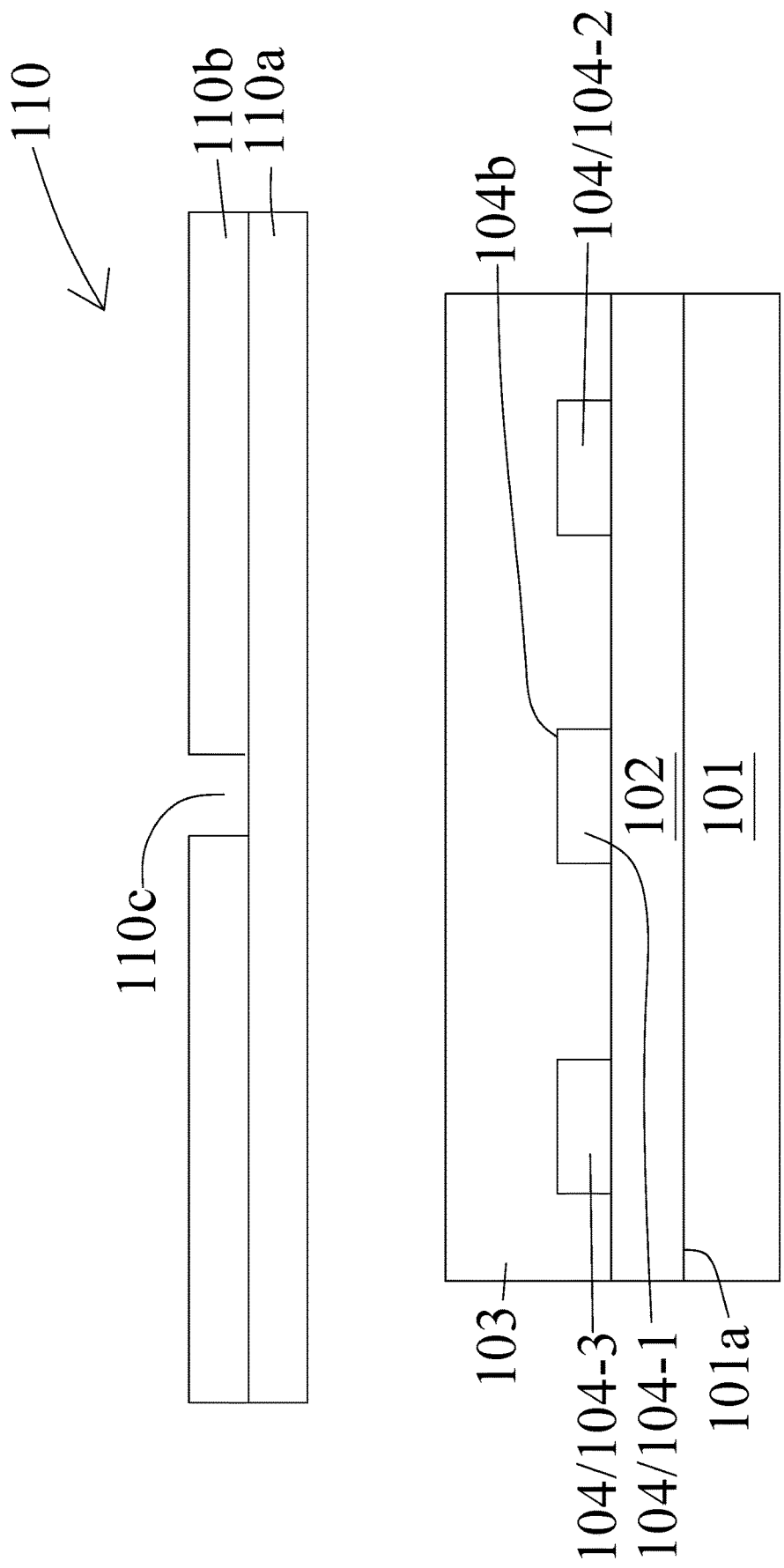

In operation 204, a photomask 110 is provided as shown in FIG. 9. In some embodiments, the photomask 110 includes a second substrate 110a, an opaque material 110b disposed over the second substrate 110a, and a first recess 110c extended through the opaque material 110b. In some embodiments, the second substrate 110a is transparent to a predetermined electromagnetic radiation. In some embodiments, the second substrate 110a allows the predetermined electromagnetic radiation passing through. In some embodiments, the second substrate 110a is quartz, fused quartz, glass or other suitable materials. In some embodiments, the predetermined electromagnetic radiation is ultraviolet (UV), laser, visible light, x-ray, extreme ultraviolet (EUV), deep ultraviolet (DUV), ions beam, electrons beam, etc.

Figure 10:
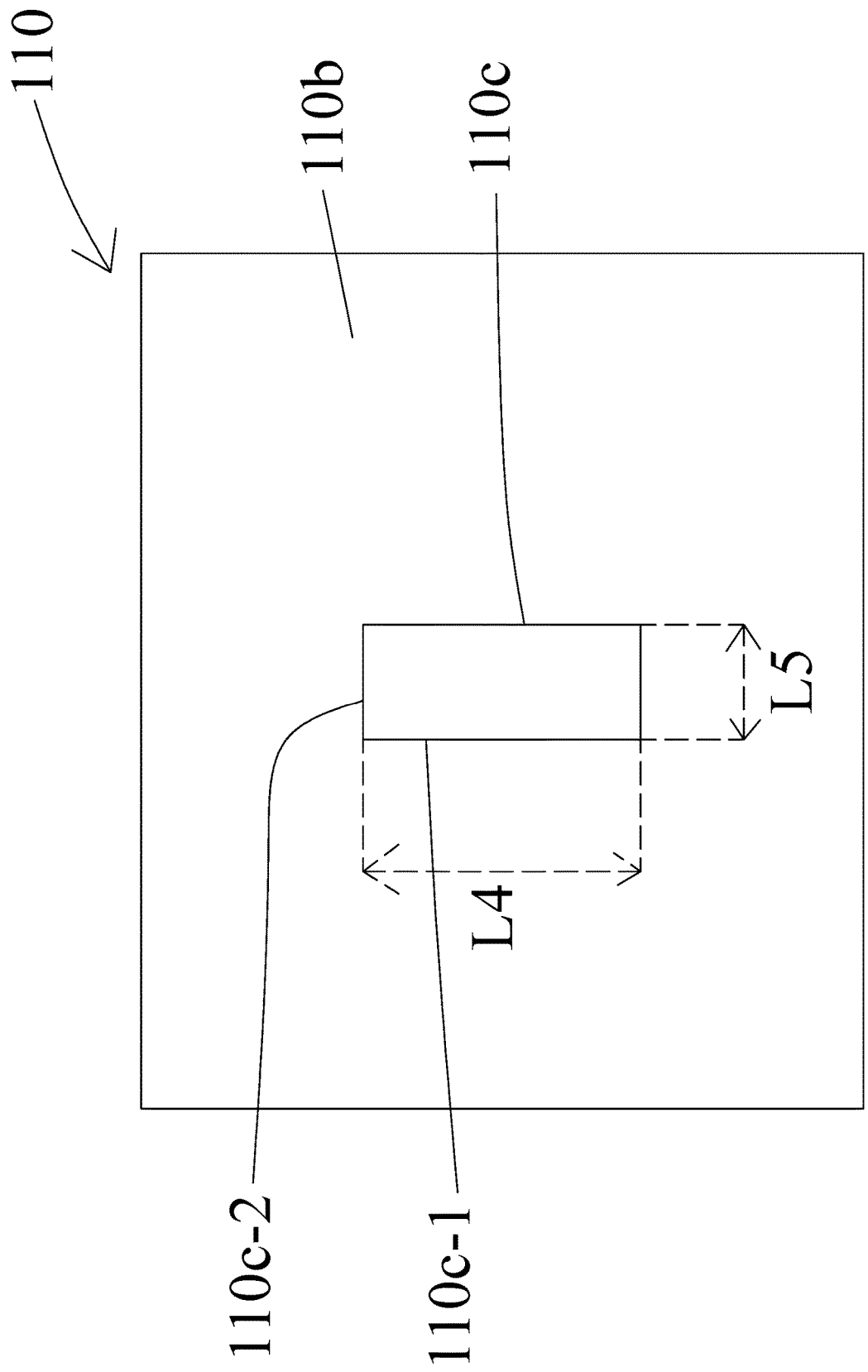

In some embodiments, the opaque material 110b includes chromium (Cr) or any other suitable material. In some embodiments, the opaque material 110b is configured to block the predetermined electromagnetic radiation. The predetermined electromagnetic radiation cannot pass through the opaque material 110b. In some embodiments, the first recess 110c is extended through the opaque material 110b. In some embodiments, a portion of the second substrate 110a is exposed by the first recess 110c In some embodiments, the predetermined electromagnetic radiation can pass through the second substrate 110a through the first recess 110c. FIG. 10 is a schematic top view of the photomask 110. In some embodiments as shown in FIG. 10, a cross section of the first recess 110c substantially parallel to the first surface 101a of the first substrate 101 is in a rectangular shape. In some embodiments, the cross section of the first recess 110c includes a first side 110c-1 and a second side 110c-2 substantially orthogonal to the first side 110c-1. In some embodiments, a first length L4 of the first side 110c-1 of the first recess 110c is substantially greater than a second length L5 of the second side 110c-2 of the first recess 110c.

In operation 205, the photomask 110 is placed over the dielectric layer 103 as shown in FIG. 9. In some embodiments, the photomask 110 is aligned with the dielectric layer 103, such that a predetermined portion of the dielectric layer 103 is aligned with the first recess 110c of the photomask 110.

In operation 206, the predetermined electromagnetic radiation is projected over the photomask 110 through the first recess 110c towards the dielectric layer 103 as shown in FIG. 9. In some embodiments, the predetermined electromagnetic radiation can pass through the second substrate 110a through the first recess 110c and can reach the dielectric layer 103. In some embodiments, the predetermined portion of the dielectric layer 103 is exposed to the predetermined electromagnetic radiation. In some embodiments, the exposed predetermined portion of the dielectric layer 103 is dissolvable by a developer solution while the rest of the dielectric layer 130 is not dissolvable by the developer solution.

Figure 11:
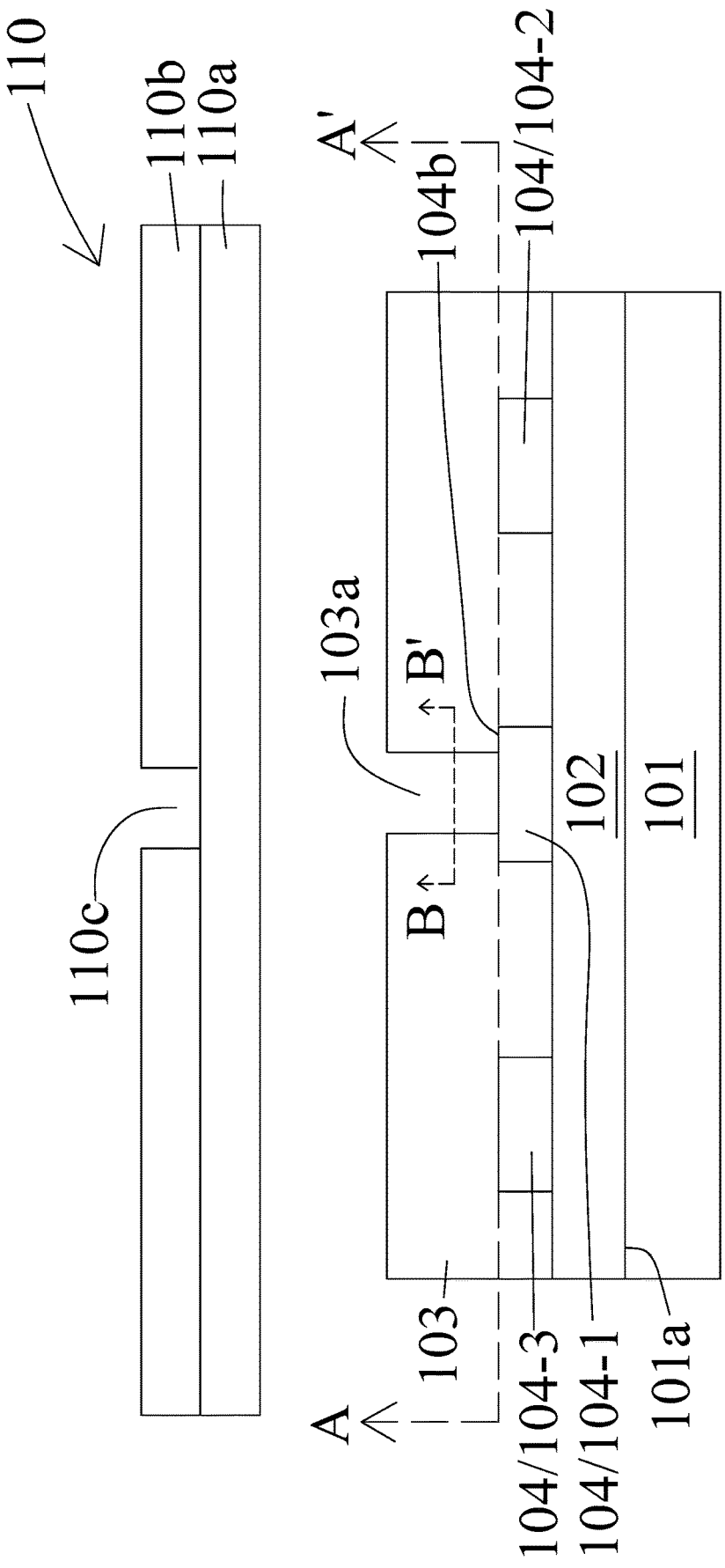

In operation 207, the predetermined portion of the dielectric layer 103 exposed to the predetermined electromagnetic radiation is removed as shown in FIG. 11. In some embodiments, the predetermined portion of the dielectric layer 103 is removed to form a second recess 103a. In some embodiments, the second recess 103a is extended through the dielectric layer 103. In some embodiments, the first recess 110c of the photomask 110 is vertically aligned with the second recess 103a of the dielectric layer 103. In some embodiments, the predetermined portion of the dielectric layer 103 is removed by etching or any other suitable operations. In some embodiments, a portion of the first conductive line 104-1 is exposed by the second recess 103a. In some embodiments, a portion of the second surface 104b is exposed by the second recess 103a.

Figure 12:
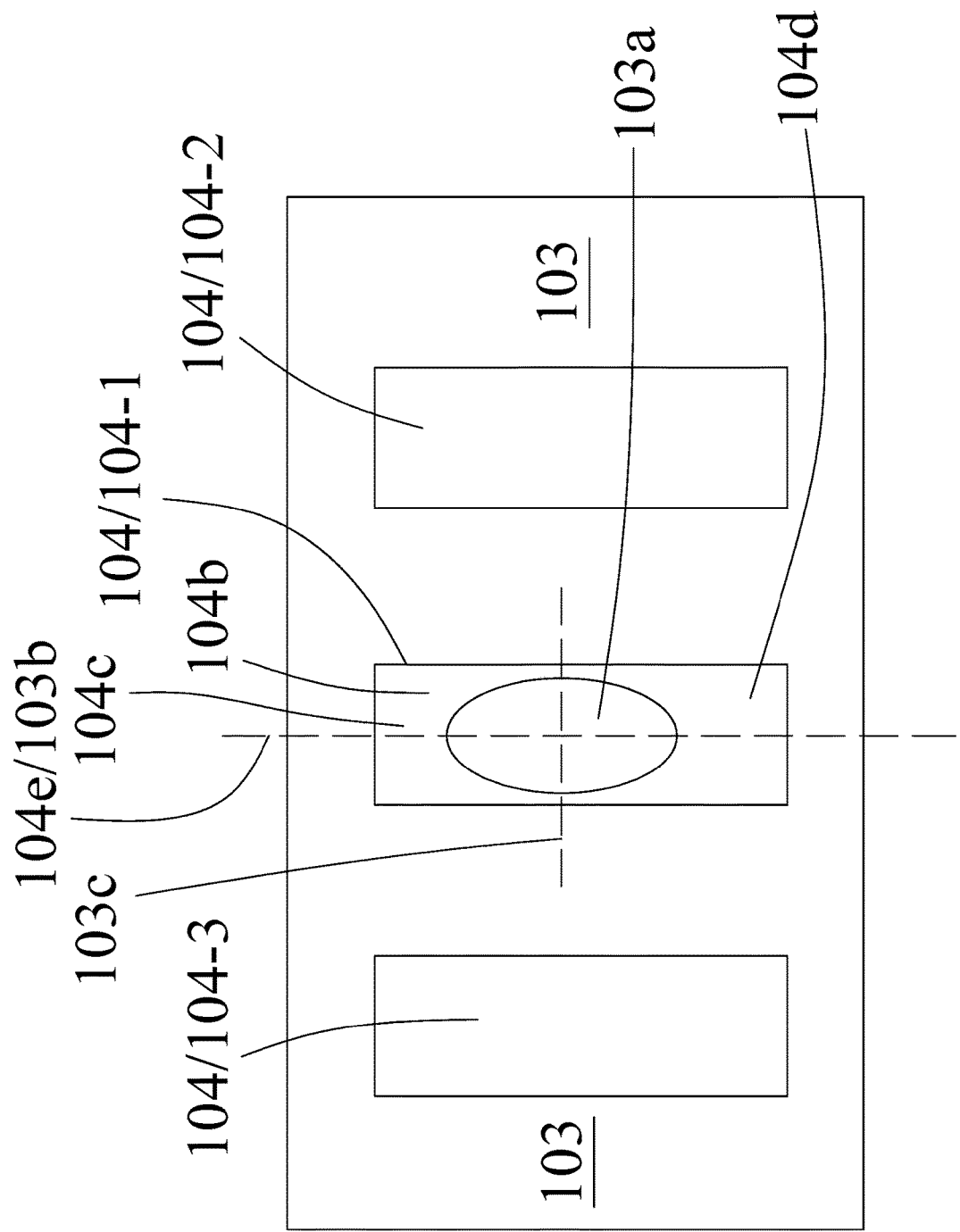

In some embodiments, the second recess 103a includes a cross section along BB'. In some embodiments, the cross section of the second recess 103a along BB' is in an elliptical shape. FIG. 12 is a schematic cross sectional view of FIG. 11 along AA'. In some embodiments, the cross section of the second recess 103a along AA' is in an elliptical shape. In some embodiments, the cross section of the second recess 103a includes a fourth central axis 103b and a fifth central axis 103c substantially orthogonal to the fourth central axis 103b. In some embodiments, the fourth central axis 103b is disposed along a longest length of the cross section of the second recess 103a, and the fifth central axis 103c is disposed along a shortest length of the cross section of the second recess 103a.

Figure 13:
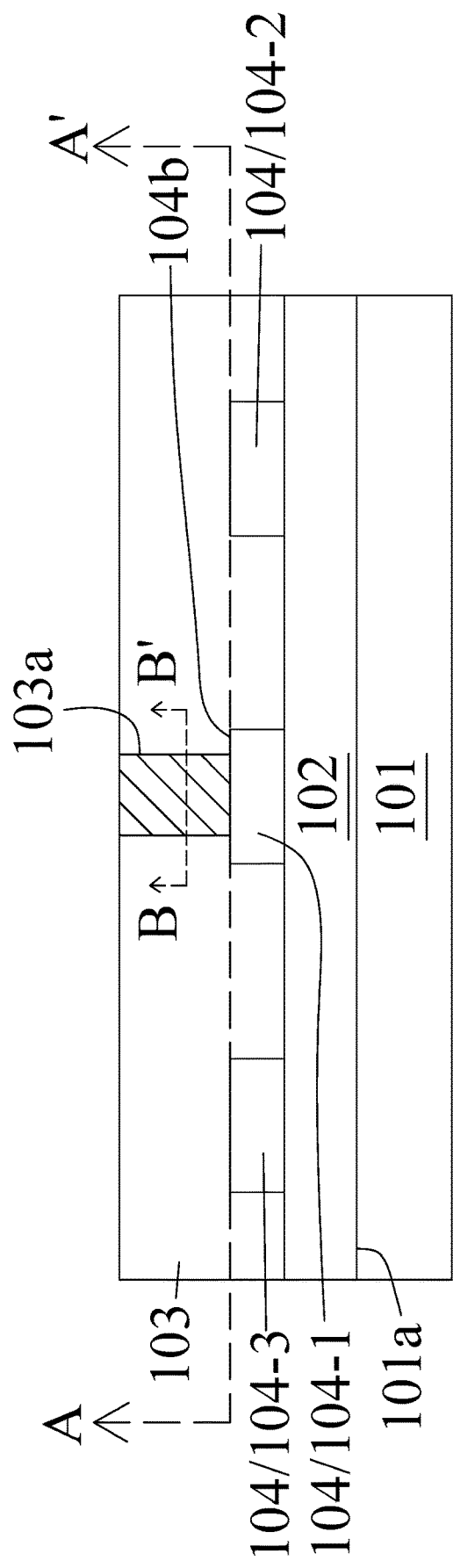

In operation 208, a conductive material is disposed into the second recess 103a to form a conductive via 105 as shown in FIG. 13. In some embodiments, the conductive material is disposed by sputtering, electroplating or any other suitable operations. In some embodiments, the conductive material includes copper, gold, silver, aluminum or the like.

Figure 14:
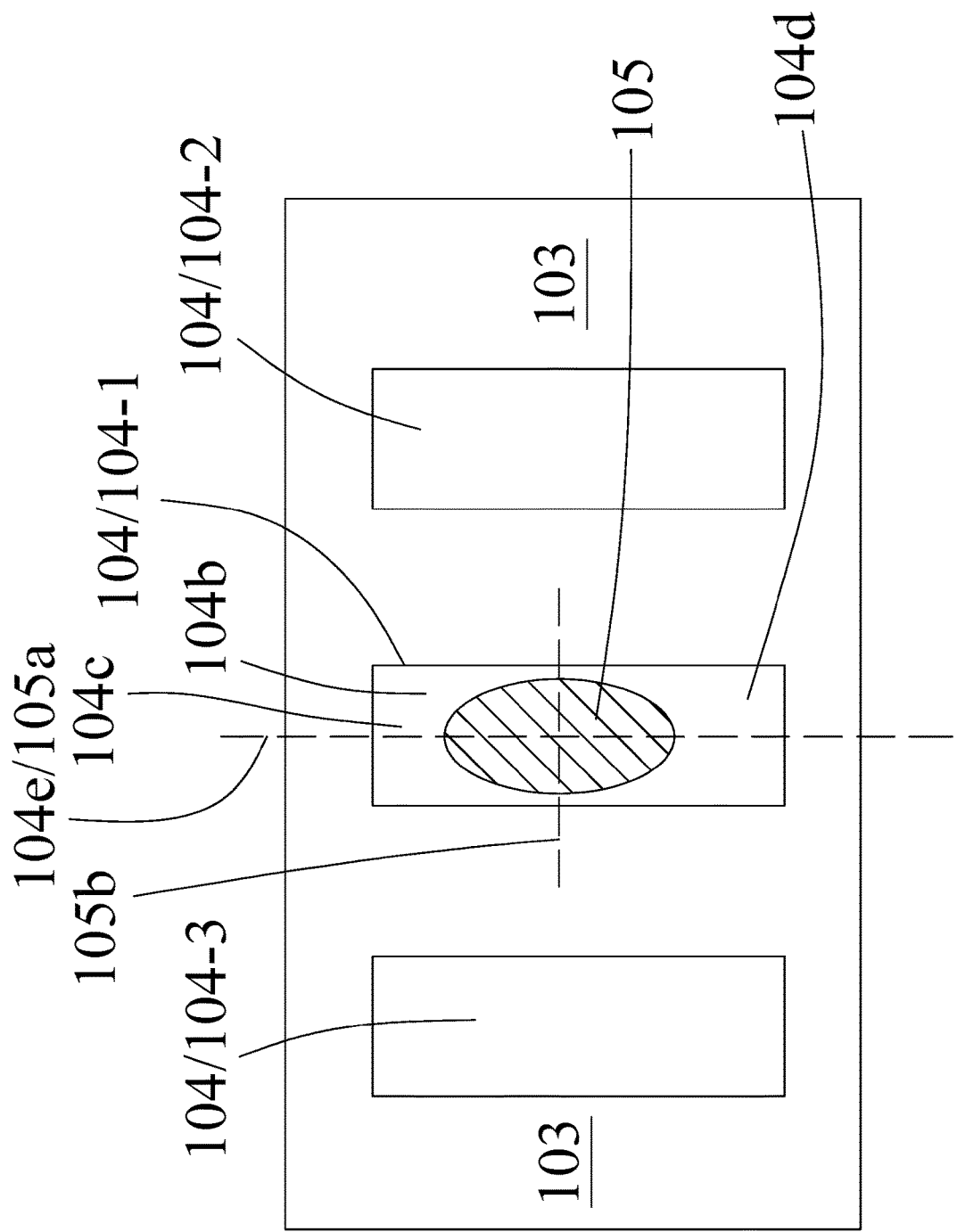

In some embodiments, the conductive via 105 includes a cross section substantially parallel to the first surface 101a of the substrate 101. In some embodiments, the conductive via 105 includes a cross section along BB'. In some embodiments, the cross section of the conductive via 105 along BB' is in an elliptical shape. FIG. 14 is a schematic cross sectional view of FIG. 13 along AA'. In some embodiments, the conductive via 105 includes a cross section along AA'. In some embodiments, the cross section of the conductive via along AA' is in an elliptical shape.

In some embodiments, the cross section of the conductive via 105 includes a second central axis 105a and a third central axis 105b substantially orthogonal to the second central axis 105a. In some embodiments, the second central axis 105a is disposed along a longest length of the cross section of the conductive via 105, and the third central axis 105b is disposed along a shortest length of the cross section of the conductive via 105.

Figure 15:
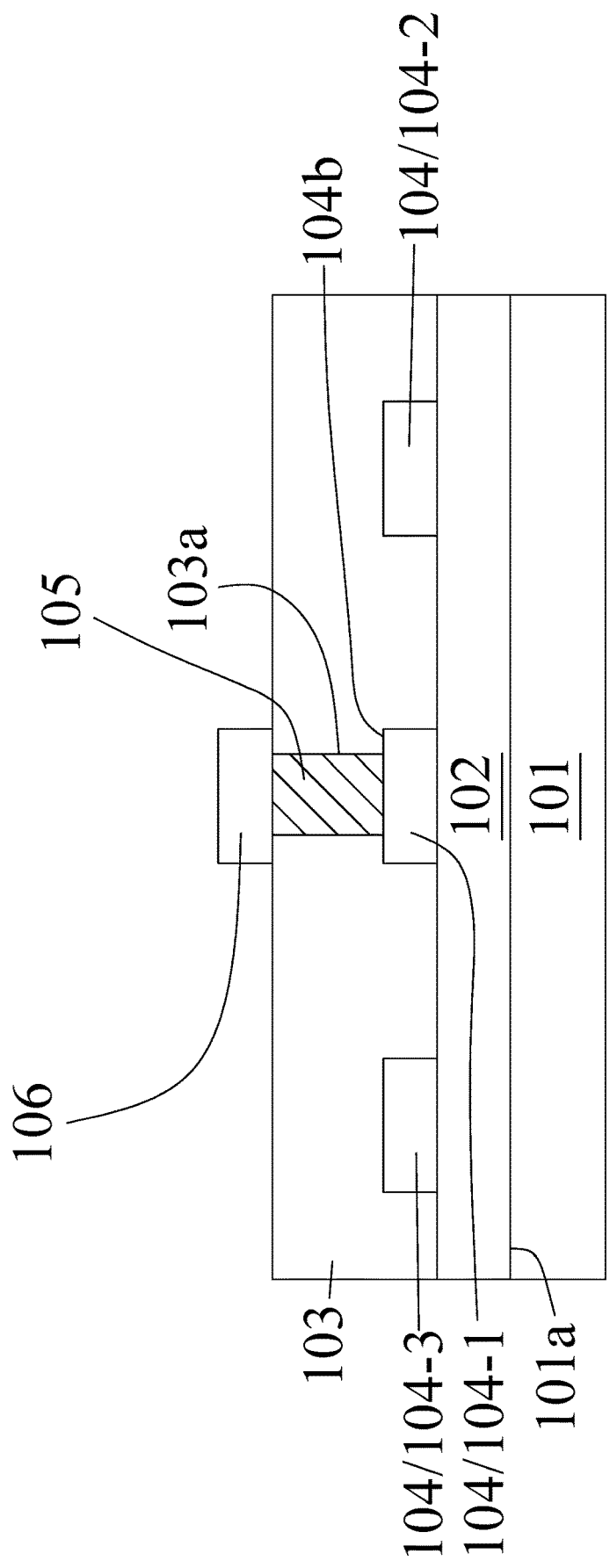

In some embodiments, a fourth conductive line 106 is formed over the conductive via 105 as shown in FIG. 15. In some embodiments, the fourth conductive line 106 is formed by sputtering, electroplating or any other suitable operations. In some embodiments, the fourth conductive line 106 is extended over the dielectric layer and coupled with the conductive via 105. In some embodiments, the fourth conductive line 106 is extended above and substantially orthogonal to the first conductive line 104-1, the second conductive line 104-2 or the third conductive line 104-3. In some embodiments, the fourth conductive line 106 includes copper, gold, silver, aluminum or the like.

Figure 16:
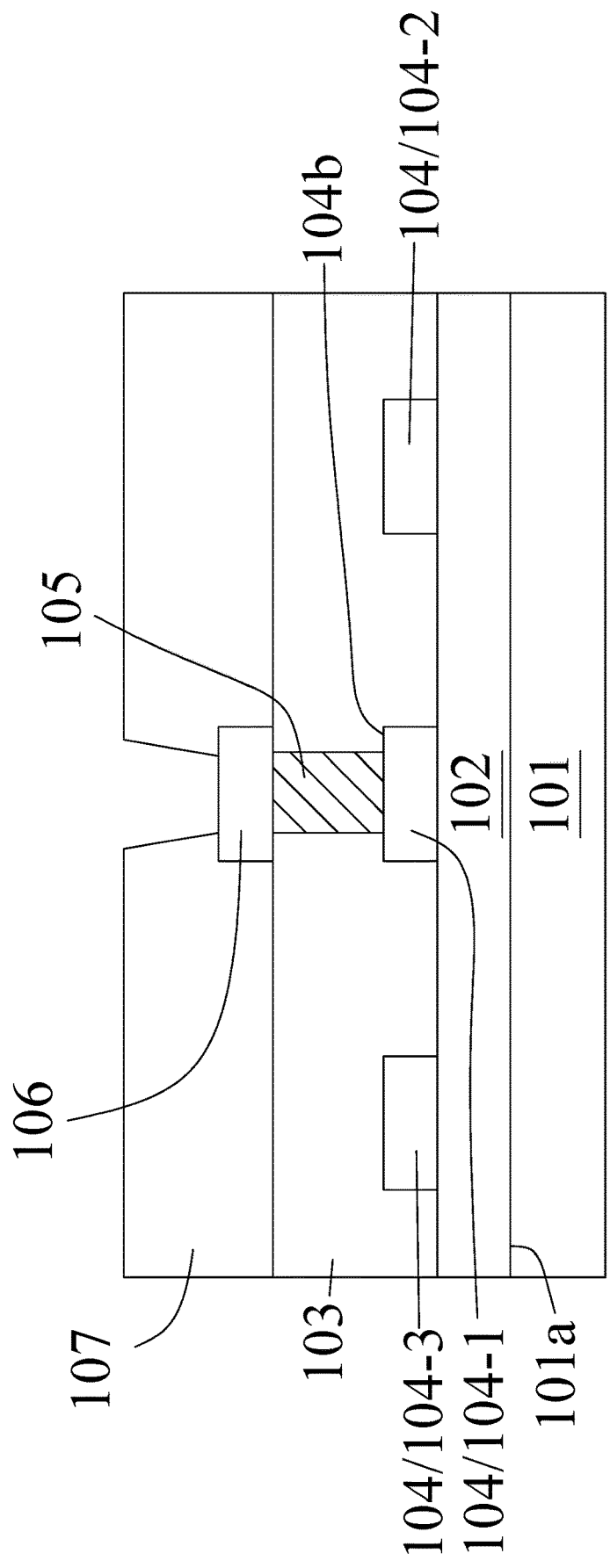
Figure 17:
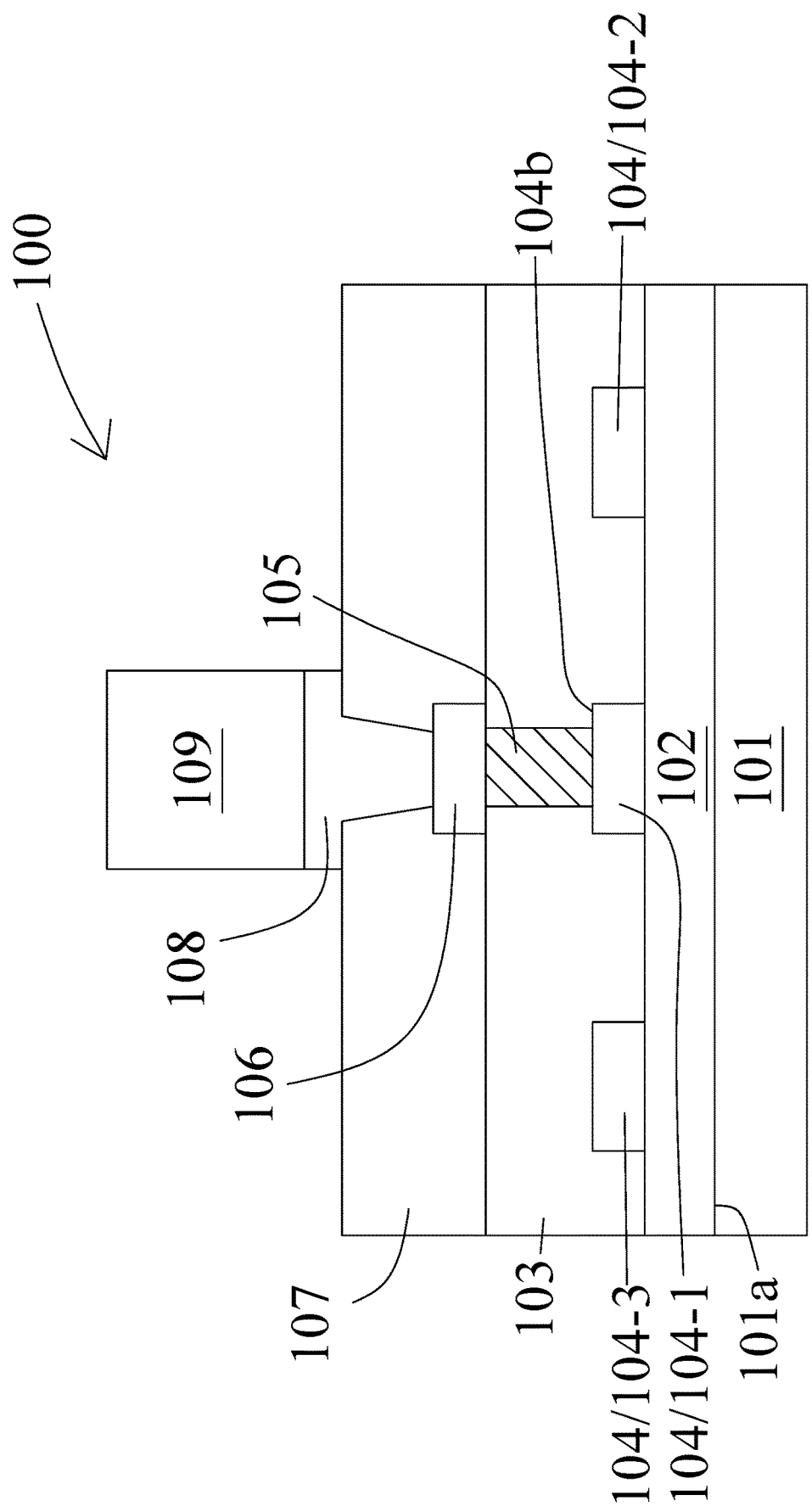

In some embodiments, a second dielectric layer 107 is formed over the dielectric layer 103 as shown in FIG. 16. In some embodiments, the second dielectric layer 107 surrounds the fourth conductive line 106. In some embodiments, the second dielectric layer 107 is formed by disposing a dielectric material such as silicon oxide or the like. In some embodiments, the dielectric material is disposed by CVD or any other suitable operations. In some embodiments, a portion of the second dielectric layer 107 is removed to expose a portion of the fourth conductive line 106. In some embodiments, the removal of the portion of the second dielectric layer 107 includes photolithography, etching and any other suitable operations.

In some embodiments, a conductive pad 108 is formed over the fourth conductive line 106. In some embodiments, a portion of the conductive pad 108 is extended through the second dielectric layer 107 and is contacted with the fourth conductive line 106. In some embodiments, the conductive pad 108 is under bump metallization (UBM) pad. In some embodiments, the conductive pad 108 includes gold, silver, copper, nickel, tungsten, aluminum, palladium and/or alloys thereof. In some embodiments, the conductive pad 108 is formed by sputtering, evaporation, electroplating or any other suitable operations.

In some embodiments, a conductive bump 109 is formed over the conductive pad 108. In some embodiments, the conductive bump 109 is configured to electrically connect to a circuitry or a conductive structure. In some embodiments, the conductive bump 109 includes conductive material includes solder, copper, nickel, gold or the like. In some embodiments, the conductive bump 109 is a conductive pillar, a solder ball, microbump or the like. In some embodiments, the conductive bump 109 is formed by lithography, electroplating, stencil printing or any other suitable operations. In some embodiments, a semiconductor structure 100 as described above or shown in FIG. 1 is formed.

In some embodiments, a semiconductor structure includes a substrate including a first surface; a dielectric layer disposed over the first surface of the substrate; a first conductive line surrounded by the dielectric layer and extended over the first surface of the substrate; a conductive via disposed over the first conductive line and extended through the dielectric layer; a second conductive line extended over the dielectric layer and coupled with the conductive via; and a cross section of the conductive via substantially parallel to the first surface of the substrate, wherein the first conductive line includes a second surface at least partially interfaced with the conductive via, the second surface of the first conductive line includes a first end, a second end opposite to the first end and a first central axis passing through the first end and the second end, the cross section of the conductive via includes a second central axis substantially parallel to the first central axis and a third central axis substantially orthogonal to the second central axis, the cross section of the conductive via includes a longest length along the second central axis and a shortest length along the third central axis.

In some embodiments, the cross section of the conductive via is in an elliptical shape. In some embodiments, the first conductive line is in a rectangular shape. In some embodiments, the conductive via is substantially orthogonal to the first surface of the substrate. In some embodiments, the second central axis is disposed above and vertically aligned with the first central axis. In some embodiments, the first conductive line is substantially orthogonal to the second conductive line. In some embodiments, the semiconductor structure further includes a third conductive line surrounded by the dielectric layer, disposed adjacent to the first conductive line and extended substantially parallel to the first conductive line, wherein the conductive via is isolated from the third conductive line.

In some embodiments, a gap between the first conductive line and the third conductive line is about 20 nm to about 25 nm. In some embodiments, the third conductive line is substantially orthogonal to the second conductive line. In some embodiments, the shortest length of the cross section of the conductive via is substantially less than a width of the first conductive line substantially parallel to the third central axis of the cross section of the conductive via. In some embodiments, a portion of the cross section of the conductive via is protruded from the second surface of the first conductive line.

In some embodiments, a semiconductor structure includes a substrate including a first surface; a dielectric layer disposed over the first surface of the substrate; a first conductive line surrounded by the dielectric layer and extended over the first surface of the substrate; a second conductive line surrounded by the dielectric layer, extended over the first surface of the substrate and substantially parallel to the first conductive line; a third conductive line surrounded by the dielectric layer, extended over the first surface of the substrate and substantially parallel to the first conductive line and the second conductive line; a conductive via disposed over the first conductive line and extended through the dielectric layer; and a cross section of the conductive via substantially parallel to the first surface of the substrate, wherein the first conductive line is disposed between the second conductive line and the third conductive line, the first conductive line includes a second surface at least partially interfaced with the conductive via, the second surface of the first conductive line includes a first end, a second end opposite to the first end and a first central axis passing through the first end and the second end, the cross section of the conductive via includes a second central axis substantially parallel to the first central axis and a third central axis substantially orthogonal to the second central axis, the cross section of the conductive via includes a longest length along the second central axis and a shortest length along the third central axis.

In some embodiments, the conductive via is isolated from the second conductive line and the third conductive line. In some embodiments, a first gap between the first conductive line and the second conductive line is substantially same as a second gap between the first conductive line and the third conductive line. In some embodiments, the first gap and the second gap are about 20 nm to about 25 nm. In some embodiments, the semiconductor structure further includes a fourth conductive line extended over the dielectric layer and coupled with the conductive via, wherein the fourth conductive line is extended above and substantially orthogonal to the first conductive line, the second conductive line and the third conductive line. In some embodiments, the cross section of the conductive via is substantially coplanar with the second surface of the first conductive line, a portion of the cross section of the conductive via is protruded towards the second conductive line or the third conductive line.

In some embodiments, a method of manufacturing a semiconductor structure includes providing a first substrate including a first surface; forming a first conductive line over the first surface of the first substrate; disposing a dielectric layer over the first surface of the first substrate and the first conductive line; providing a photomask including a second substrate, an opaque material disposed over the second substrate and a first recess extended through the opaque material; placing the photomask over the dielectric layer; projecting a predetermined electromagnetic radiation over the photomask through the first recess towards the dielectric layer; removing a portion of the dielectric layer exposed to the predetermined electromagnetic radiation to form a second recess extended through the dielectric layer; disposing a conductive material into the second recess to form a conductive via; and forming a second conductive line over the dielectric layer and coupled with the conductive via, wherein a cross section of the first recess substantially parallel to the first surface of the first substrate includes a first side and a second side substantially orthogonal to the first side, a first length of the first side is substantially greater than a second length of the second side.

In some embodiments, the cross section of the first recess of the photomask is in a rectangular shape. In some embodiments, a cross section of the second recess of the dielectric layer substantially parallel to the first surface of the first substrate is in an elliptical shape.

In some embodiments, a semiconductor structure includes a substrate including a first surface; a dielectric layer disposed over the first surface of the substrate; a first conductive line surrounded by the dielectric layer and extended over the first surface of the substrate; a second conductive line disposed adjacent to the first conductive line, surrounded by the dielectric layer and extended parallel to the first conductive line; a conductive via disposed over the first conductive line and extended through the dielectric layer; and a cross section of the conductive via substantially parallel to the first surface of the substrate, wherein the cross section of the conductive via is at least partially protruded from the first conductive line towards the second conductive line.

In some embodiments, the conductive via is isolated from the second conductive line. In some embodiments, a shortest length of the conductive via is substantially greater than a width of the first conductive line. In some embodiments, the shortest length of the conductive via is substantially greater than a width of the second conductive line. In some embodiments, the cross section of the conductive via is in an elliptical shape. In some embodiments, the first conductive line and the second conductive line are in rectangular shape. In some embodiments, a gap between the first conductive line and the second conductive line is about 20 nm to about 25 nm. In some embodiments, a first interface between the conductive via and the dielectric layer is substantially coplanar with a second interface between the conductive via and the first conductive line. In some embodiments, the semiconductor structure further includes a third conductive line extended over the dielectric layer and coupled with the conductive via, wherein the cross section of the conductive via is at least partially protruded from the third conductive line. In some embodiments, the first conductive line includes a second surface at least partially interfaced with the conductive via, the second surface of the first conductive line includes a first end, a second end opposite to the first end and a first central axis passing through the first end and the second end, the cross section of the conductive via includes a second central axis disposed above and vertically aligned with the first central axis.

In some embodiments, a semiconductor structure includes a substrate including a first surface; a dielectric layer disposed over the first surface of the substrate; a first conductive line surrounded by the dielectric layer and extended over the first surface of the substrate; a conductive via disposed over the first conductive line and extended through the dielectric layer; and a cross section of the conductive via substantially parallel to the first surface of the substrate, wherein the first conductive line includes a second surface at least partially interfaced with the conductive via, the second surface of the first conductive line includes a first end, a second end opposite to the first end and a first central axis passing through the first end and the second end, the cross section of the conductive via is in an elliptical shape and includes a second central axis deviated from the first central axis and a third central axis substantially orthogonal to the second central axis, the cross section of the conductive via includes a longest length along the second central axis and a shortest length along the third central axis.

In some embodiments, the shortest length of the cross section of the conductive via is substantially less than a width of the first conductive line along the third central axis, further comprising a second conductive line disposed adjacent to the first conductive line, surrounded by the dielectric layer and extended parallel to the first conductive line, wherein a first lateral distance between the first conductive line and the second conductive line is substantially less than a second lateral distance between the second conductive line and the conductive via. In some embodiments, the semiconductor structure further includes a third conductive line extended over the dielectric layer and coupled with the conductive via, wherein the conductive via is entirely disposed under the third conductive line. In some embodiments, the semiconductor structure further includes a fourth conductive line disposed adjacent to the first conductive line, surrounded by the dielectric layer and extended parallel to the first conductive line and the second conductive line, wherein the first conductive line is disposed between the second conductive line and the fourth conductive line, and the conductive via is proximal to the fourth conductive line and distal to the second conductive line.

In some embodiments, a method of manufacturing a semiconductor structure includes providing a substrate including a first surface; forming a conductive line over the first surface of the substrate; disposing a dielectric layer over the first surface of the substrate and the conductive line; providing a photomask including a first recess indented into the photomask; placing the photomask over the dielectric layer; projecting a predetermined electromagnetic radiation over the photomask through the first recess towards the dielectric layer; removing a portion of the dielectric layer exposed to the predetermined electromagnetic radiation to form a second recess extended through the dielectric layer; and disposing a conductive material into the second recess to form a conductive via, wherein a cross section of the first recess of the photomask substantially parallel to the first surface of the substrate is in a rectangular shape, a cross section of the second recess of the dielectric layer substantially parallel to the first surface of the first substrate is in an elliptical shape and at least partially overlaps with the cross section of the first recess.

In some embodiments, the first recess is vertically aligned with the second recess, the conductive line is at least partially exposed through the second recess. In some embodiments, a width of the second recess is substantially greater than a width of the conductive line. In some embodiments, the portion of the dielectric layer is removed by etching operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a substrate;
   a dielectric layer disposed over the substrate;
   a conductive line surrounded by the dielectric layer and extending over the substrate; and
   a conductive via disposed over the conductive line and extending through the dielectric layer,
   wherein a first interface between the conductive via and the dielectric layer is substantially coplanar with a second interface between the conductive via and the conductive line.

2. The semiconductor structure of claim 1, wherein a portion of the dielectric layer is disposed under the conductive via and between the conductive via and the substrate.

3. The semiconductor structure of claim 2, wherein the portion of the dielectric layer surrounds the conductive line.

4. The semiconductor structure of claim 1, wherein the first interface is protruded from the second interface.

5. The semiconductor structure of claim 1, wherein the first interface is protruded from the conductive line.

6. The semiconductor structure of claim 1, wherein a width of the first interface is substantially less than a width of the second interface.

7. The semiconductor structure of claim 1, wherein the conductive via is substantially orthogonal to the conductive line.

8. The semiconductor structure of claim 1, wherein the conductive line is in a rectangular shape.

9. The semiconductor structure of claim 1, wherein a cross section of the conductive via is in an elliptical shape.

10. The semiconductor structure of claim 1, wherein a width of the conductive via is substantially greater than or equal to a width of the conductive line.

11. A semiconductor structure, comprising:
    a substrate including a surface;
    a dielectric layer disposed over the surface of the substrate;
    a conductive line surrounded by the dielectric layer, extending over the surface of the substrate, and having a first width; and
    a conductive via disposed over the conductive line and extending through the dielectric layer,
    wherein the conductive via has a cross section substantially parallel to the surface of the substrate, the cross section has a second width in parallel to the first width, and the second width is substantially greater than or equal to the first width.

12. The semiconductor structure of claim 11, wherein the conductive via is protruded from the conductive line.

13. The semiconductor structure of claim 11, wherein a portion of the dielectric is disposed on a top surface of the conductive line.

14. The semiconductor structure of claim 11, wherein a portion of the dielectric is disposed under the conductive via.

15. The semiconductor structure of claim 11, wherein a width of an interface between the conductive line and the conductive via is substantially less than the first width.

16. The semiconductor structure of claim 11, wherein a width of an interface between the conductive line and the conductive via is substantially less than the second width.

17. The semiconductor structure of claim 11, wherein the conductive via is substantially orthogonal to the surface of the substrate.

18. A method of manufacturing a semiconductor structure, comprising:
    providing a substrate;
    forming a conductive line over the substrate;
    disposing a dielectric layer over the substrate and the conductive line;
    removing a portion of the dielectric layer to form a recess extending through the dielectric layer and at least partially exposing the conductive line; and
    disposing a conductive material into the recess to form a conductive via, wherein a width of the recess is substantially greater than or equal to a width of the conductive line.

19. The method of claim 18, wherein the conductive material is disposed on the conductive line and the dielectric layer.

20. The method of claim 18, wherein the recess is in an elliptical shape.

* * * * *